United States Patent [19]
Fukuda et al.

[11] Patent Number: 5,554,219
[45] Date of Patent: Sep. 10, 1996

[54] PROCESS FOR PRODUCING SINGLE-CRYSTAL BULK ZINC SELENIDE

[75] Inventors: Tsuguo Fukuda, Sendai, Japan; Peter Rudolph, Berlin, Germany; Kazuyuki Umezu, Sendai, Japan

[73] Assignee: Dowa Mining Co., Ltd., Tokyo, Japan

[21] Appl. No.: 376,896

[22] Filed: Jan. 23, 1995

[51] Int. Cl.$^6$ .................................................. C30B 11/14
[52] U.S. Cl. .................................................. 117/83; 117/1
[58] Field of Search .................................. 117/1, 3, 4, 10, 117/11, 81, 82, 83, 223, 224, 937, 956; 422/77; 373/156; 414/586; 392/429; 432/262

[56] References Cited

U.S. PATENT DOCUMENTS

| | | | |
|---|---|---|---|
| 4,983,249 | 1/1991 | Taguchi et al. | 117/10 |
| 5,169,799 | 12/1992 | Taguchi et al. | 117/956 |

FOREIGN PATENT DOCUMENTS

| | | | |
|---|---|---|---|
| 0333120 | 9/1989 | European Pat. Off. | 117/10 |
| 0338252 | 10/1989 | European Pat. Off. | 117/10 |
| 63-13097 | 6/1988 | Japan | 117/83 |

OTHER PUBLICATIONS

J. Cryst. Growth, 41 (1977) 103–108.
J. Cryst. Growth, 98 (1989) 302–308.
J. Cryst. Growth, 117 (1992) 75–79.
J. Cryst. Growth, 117 (1992) 80–84.
J. Cryst. Growth, 86 (1998) 132–137.

*Primary Examiner*—Felisa C. Garrett
*Attorney, Agent, or Firm*—Frishauf, Holtz, Goodman, Langer & Chick, P.C.

[57] ABSTRACT

When producing a single-crystal bulk ZnSe from a melt by a high-pressure melt technique in a vertical Bridgman (VB) furnace or a vertical gradient freezing (VGF) furnace, preliminarily grown polycrystalline ZnSe (which may be a crystal solely composed of twins) is used as a seed and, after melting the starting ZnSe material and part of the seed, a twin-free ZnSe bulk crystal is grown on the seed; alternatively, polycrystalline ZnSe is grown at the tip of the growing crystal and part of it is melted, followed by growing a single crystal on that polycrystal to produce a twin-free, high-purity ZnSe bulk crystal. In either way, the process assures that twin-free single crystals of bulk ZnSe can be produced with good reproducibility without adding dopants or using any materials that are difficult to obtain.

10 Claims, No Drawings

PROCESS FOR PRODUCING SINGLE-CRYSTAL BULK ZINC SELENIDE

BACKGROUND OF THE INVENTION

This invention relates to a process for producing twin-free single-crystal bulk zinc selenide (ZnSe) suitable for use as a substrate for fabricating a blue-emitting semiconductor laser or LED by epitaxial growth of ZnSe compound in thin film.

Various methods are currently used to produce single-crystal bulk ZnSe from a melt and representative examples include: (1) an ordinary high-pressure melt process that uses a crucible having a fine tube in the growth start region as described in J. Cryst. Growth, 41 (1977) 103–108; (2) a process that performs growth in a Zn atmosphere as described in J. Cryst. Growth, 98 (1989) 302–308; (3) a high-pressure melt process that uses a crucible having a cone angle of 30 degrees as described in J. Cryst. Growth, 117 (1992) 75–79; (4) a method that uses a "sealed hot-walled system" and a seed crystal as described in J. Cryst. Growth, 117 (1992) 80–84; and (5) a process that performs doping as described in J. Cryst. Growth, 86 (1988) 132–137.

In the production of single-crystal bulk ZnSe, the avoidance of twin formation is one of the major objectives to be attained. However, processes (1) and (2) do not take the formation of twins into account and only processes (3), (4) and (5) have succeeded in the growth of twin-free single-crystal bulk ZnSe. Nevertheless, process (3) is not very different from the ordinary high-pressure process and, what is more, the reproducibility of results is not taken into account. In process (4), a twin-free single crystal (having a smaller diameter than the constant-diameter portion of the growing crystal) is used as a seed; on the other hand, manganese (Mn) which may be considered as an impurity is added in process (5). Thus, the conventional processes under consideration have suffered from the following drawbacks: twins are formed in processes (1) and (2); process (3) does not have any means to prevent twin formation and the reproducibility of its results is not clearly established; (4) process involves great difficulty in obtaining a twin-free single crystal useful as a seed; and the effect that would be caused by the dopant Mn on the substrate characteristics is not clearly known with process (5).

SUMMARY OF THE INVENTION

An object, therefore, of the present invention is to provide a process by which twin-free single-crystal bulk ZnSe can be produced from a melt with good reproducibility using an easily available material instead of using a difficult-to-obtain twin-free single crystal or adding dopants.

With a view to attaining this object, the present inventors repeated many experiments to examine closely the process of ZnSe crystal growth. As a result, they found the following phenomena: if the crystal of bulk ZnSe is to be produced from a melt and when a polycrystal exists that has the same diameter as the crystal to be grown, a twin-free single crystal in bulk form is obtained on said polycrystal; and even in the case where a crystal that is grown by the ordinary high-pressure melt process and which is solely composed of twins is used as a seed, the seed is converted to a polycrystalline form in the process of temperature elevation for melting the starting material and, thereafter, a twin-free single crystal in bulk form is obtained on that polycrystal. The present invention has been accomplished on the basis of these findings.

DETAILED DESCRIPTION OF THE INVENTION

The present invention relates generally to a process for producing a single-crystal bulk ZnSe from a melt by a high-pressure melt technique in a vertical Bridgman (VB) furnace or a vertical gradient freezing furnace. In its first aspect, the invention provides such a process that is characterized by using polycrystaliline ZnSe as a seed and growing a single crystal on said seed. In its second aspect, the invention provides such a process that is characterized by using polycrystalline ZnSe as a seed, melting the starting material, and part of the seed, and growing a single crystal on said seed. In its third aspect, the invention provides a process according to the first or second aspect, wherein said seed is a ZnSe crystal solely composed of twins. In its fourth aspect, the invention provides a process according to any one of the first to the third aspect, wherein the seed has the same diameter as the single crystal to be grown. In its fifth aspect, the present invention provides a process for producing a single-crystal bulk ZnSe from a melt by a high-pressure melt technique in a VF or VGF furnace, characterized in that polycrystalline ZnSe is grown from the ZnSe melt and, after temporary interruption of the growth, part of the polycrystalline ZnSe is melted again, followed by the growth of a single crystal on that polycrystal. In its sixth aspect, the invention provides a process according to the fifth aspect, wherein the polycrystalline ZnSe has the same diameter as the single crystal to be grown.

The process of the present invention is classified as one of two categories according to the conditions of crystal growth. In the first approach, preliminarily grown polycrystalline ZnSe (which may be a crystal solely composed of twins) is placed as a seed on the bottom of a crucible; a starting ZnSe material is placed on top of the seed; the crucible is put in a VB or VGF furnace and heated to a predetermined temperature higher than the melting point of ZnSe in an insert gas atmosphere such as nitrogen so that the starting material or part of the seed will melt; thereafter, the crucible is moved to the lower-temperature region (i.e., downward) at a predetermined rate so that a single crystal is grown on the seed. This method may be described as a "two-stage process".

In the second approach, a crucible solely charged with a starting ZnSe material is put in a VB or VGF furnace and heated to a predetermined temperature higher than the melting point of ZnSe in an inert gas atmosphere such as nitrogen so that the starting material will melt; thereafter, the crucible is lowered at a comparatively fast rate so that polycrystalline ZnSe is grown only at the tip of the growing crystal; the growth is interrupted and part of the polycrystal is melted again; thereafter, the crucible is lowered at a predetermined rate so as to grow a single crystal. This method may be described as a "one-stage process".

Whichever of these methods is used, a twin-free single crystal of bulk ZnSe can be grown on the seed or polycrystalline ZnSe with good reproducibility.

The following examples are provided for the purpose of further illustrating the present invention but are in no way to be taken as limiting.

EXAMPLE 1

An experiment of producing a single-crystal bulk ZnSe was conducted using the following starting material and apparatus. The starting material was a mass of high-purity (99.999%) ZnSe that was produced by the vaporphase process at the Central Research Laboratory of DOWA MINING CO., LTD. The furnace was a VB furnace (Model GHPA-202; a high-temperature and pressure atmosphere furnace manufactured by GAKEI DENKI SEISAKUSHO). The crucible was made of boron nitride and it consisted of a constant-diameter zone having an inside diameter of about 30 mm and a taper zone having a cone angle of 38' and a length of 35mm.

Single-crystal ZnSe was produced by the following procedure. Preliminarily grown polycrystalline ZnSe having a constant-diameter portion longer than about 5 mm and a taper portion was placed as a seed on the bottom of the crucible and the starting material was put on top of it. The crucible was mounted on the shaft in the VB furnace and placed in position. After nitrogen purge, the furnace was supplied with nitrogen to a pressure of 30 kgf/cm$^2$ (nitrogen may be replaced by another inert gas). The temperature in the furnace was raised to 1,550° C. (maximum design temperature), which was maintained for 5 hours to melt the starting material and part of the seed (extending to about 5 mm below the top end of the constant-diameter portion) in the crucible. Thereafter, the crucible was lowered at a rate of 3–5 mm/h to achieve crystal growth on top of the seed. The thermal gradient near the melting point of ZnSe was about 22° C./cm. When all of the molten starting material fully solidified, the movement of the crucible was stopped and the temperature in the crucible was lowered to room temperature for crystal recovery. As a result, a twin-free ZnSe single crystal was obtained on the seed. It had a diameter of about 28 mm and a length of about 15 mm.

EXAMPLE 2

The procedure of Example 1 was repeated except that the seed was a ZnSe crystal solely composed of twins. The seed was converted to a polycrystalline form, on top of which a twin-free ZnSe single crystal could be grown. The diameter and length of the single crystal were about 28 mm and 15 mm, respectively.

EXAMPLE 3

A crucible of the same type as used in Example 1 was charged with the same starting material as used in Example 1. The crucible was mounted on the shaft in a VB furnace of the same model as used in Example 1 and placed in position.

After nitrogen purge, the furnace was supplied with nitrogen to a pressure of 30 kgf/cm$^2$ (nitrogen may be replaced by another inert gas). The temperature in the furnace was raised to 1,630° C. (maximum design temperature), which was maintained for 5 hours to melt the starting material in the crucible. Thereafter, the crucible was lowered at a comparative fast rate higher than 20 mm/cm to achieve polycrystalline growth solely at the tip of the growing crystal. When a polycrystal having a constant-diameter portion about 5 mm long had grown, the growth process was stopped and part of the polycrystal (extending to about 5 mm below the top end of the constant-diameter portion)was melted again; subsequently, the crucible was lowered at a rate of 3–5 mm/h for single-crystal growth. The thermal gradient near the melting point of ZnSe was about 42° C./cm. When all of the molten starting material fully solidified, the movement of the crucible was stopped and the temperature in the crucible was lowered to room temperature for crystal recovery. As a result, a twin-free ZnSe single-crystal was obtained on the polycrystalline tip. It had a diameter of about 20 mm and length of about 10 mm.

As will be obvious to the skilled artisan, the process of the present invention is applicable even if a VGF furnace is substituted for the VB furnace used in Examples 1–3 and similar results are obtained.

Comparative Example

As typically shown in J. Cryst. Growth, 75 (1986) 609–612, the crystal produced by the ordinary high-pressure melt process using no seeds has in all cases a number of twins in the direction [111].

In the prior art, twin-free single crystals that are extremely difficult to obtain must be used as seeds or it is necessary to add dopants that may potentially affect the substrate characteristics and, hence, it has been difficult to produce twin-free ZnSe single crystals on an industrial scale. In contrast, the process of the present invention is capable of producing high-purity and twin-free single-crystal bulk ZnSe with good reproducibility using or without using seeds that comprise either polycrystals or crystals solely composed of twins which are easy to grow.

What is claimed is:

1. A process for producing a single-crystal bulk ZnSe from a melt by a high-pressure melt technique in a vertical Bridgman furnace (VB) or a vertical gradient freezing (VGF) furnace, wherein polycrystalline ZnSe is used as a seed and wherein a single crystal is grown on said seed.

2. A process according to claim 1 wherein said seed is a ZnSe crystal solely composed of twins.

3. A process according to claim 2 wherein said seed has the same diameter as the single crystal to be grown.

4. A process according to claim 1 wherein said seed has the same diameter as the single crystal to be grown.

5. A process for producing a single-crystal bulk ZnSe from a melt by a high-pressure melt technique in a vertical Bridgman furnace (VB) or a vertical gradient freezing (VGF) furnace, wherein polycrystalline ZnSe is used as a seed and wherein the starting material and part of the seed are melted, followed by growing a single crystal on said seed.

6. A process according to claim 5 wherein said seed is a ZnSe crystal solely composed of twins.

7. A process according to claim 6 wherein said seed has the same diameter as the single crystal to be grown.

8. A process according to claim 5 wherein said seed has the same diameter as the single crystal to be grown.

9. A process for producing a single-crystal bulk ZnSe from a melt by a high-pressure melt technique in a vertical Bridgman furnace (VB) or a vertical gradient freezing (VGF) furnace, wherein polycrystalline ZnSe is grown from the ZnSe melt and, after temporary interruption of the growth, part of the polycrystalline ZnSe is melted again, followed by the growth of a single crystal on said polycrystal.

10. A process according to claim 9 wherein the polycrystalline ZnSe has the same diameter as the single crystal to be grown.

\* \* \* \* \*

UNITED STATES PATENT AND TRADEMARK OFFICE
CERTIFICATE OF CORRECTION

PATENT NO. : 5,554,219
DATED : September 10, 1996
INVENTOR(S) : FUKUDA et al

It is certified that error appears in the above-identified patent and that said Letters Patent is hereby corrected as shown below:

Title Page, left column, insert

--[30] Foreign Application Priority Data

Jan. 25, 1994  [JP]  Japan... 6-023765--.

Signed and Sealed this

Thirty-first Day of August, 1999

Attest:

Q. TODD DICKINSON

*Attesting Officer*    *Acting Commissioner of Patents and Trademarks*